(12) United States Patent
Zhang et al.

(10) Patent No.: US 10,204,906 B2
(45) Date of Patent: Feb. 12, 2019

(54) MEMORY WITH SINGLE-EVENT LATCHUP PREVENTION CIRCUITRY

(71) Applicant: Intel Corporation, Santa Clara, CA (US)

(72) Inventors: Weimin Zhang, San Jose, CA (US); Yanzhong Xu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 74 days.

(21) Appl. No.: 15/382,095

(22) Filed: Dec. 16, 2016

(65) Prior Publication Data

US 2018/0175033 A1 Jun. 21, 2018

(51) Int. Cl.
| | |
|---|---|
| *G11C 16/04* | (2006.01) |
| *H01L 27/092* | (2006.01) |
| *G11C 11/417* | (2006.01) |
| *G11C 5/14* | (2006.01) |
| *G11C 11/412* | (2006.01) |

(52) U.S. Cl.
CPC ............ *H01L 27/0921* (2013.01); *G11C 5/14* (2013.01); *G11C 11/417* (2013.01); *G11C 11/4125* (2013.01)

(58) Field of Classification Search
CPC ......... G11C 5/06; G11C 8/08; G11C 11/4125; G11C 7/1051
See application file for complete search history.

(56) References Cited

U.S. PATENT DOCUMENTS

| | | | |
|---|---|---|---|
| 3,434,114 A | 3/1969 | Arulpragasam et al. | |
| 4,862,415 A * | 8/1989 | Nakano ................... | G11C 5/145 365/189.09 |
| 5,214,609 A * | 5/1993 | Nakai ...................... | G11C 7/02 365/189.05 |
| 5,325,328 A * | 6/1994 | Muroya ................... | G11C 7/06 365/189.05 |
| 5,696,711 A | 12/1997 | Makineni | |
| 8,482,963 B1 * | 7/2013 | Liu ......................... | G11C 11/412 365/154 |
| 8,706,790 B1 | 4/2014 | Langhammer | |
| 8,949,298 B1 | 2/2015 | Langhammer | |
| (Continued) | | | |

OTHER PUBLICATIONS

Langhammer et al., U.S. Appl. No. 15/242,923, filed Aug. 22, 2016.

*Primary Examiner* — Tuan T Nguyen
(74) *Attorney, Agent, or Firm* — Treyz Law Group, P.C.; Jason Tsai

(57) ABSTRACT

An integrated circuit that includes an array of random-access memory cells is provided. Each memory cell may include inverting circuits formed from pull-up transistors and pull-down transistors and also access transistors coupled to the inverting circuits. The pull-up transistors may be formed in an n-well. The memory cells may also be coupled to single event latch-up (SEL) prevention circuitry. The SEL prevention circuitry may include a clamping circuit, a voltage sensing circuit, and a driver circuit. In response to a single event alpha particle strike at one of the memory cells, a temporary voltage rise may be presented at the clamping circuit. The voltage sensing circuit may detect the voltage rise and direct the driver circuit to bias the n-well into deep reverse bias region. Operated in this way, the SEL prevention circuitry can mitigate SEL while minimizing memory cell leakage.

17 Claims, 9 Drawing Sheets

(56) References Cited

U.S. PATENT DOCUMENTS

| | | |
|---|---|---|
| 9,098,332 B1 | 8/2015 | Langhammer |
| 9,104,474 B2 | 8/2015 | Kaul et al. |
| 9,189,200 B1 | 11/2015 | Langhammer |
| 2007/0030741 A1* | 2/2007 | Nii .......................... G11C 5/06 |
| | | 365/189.11 |
| 2011/0013467 A1* | 1/2011 | Moore ................. G11C 11/412 |
| | | 365/190 |
| 2011/0242880 A1* | 10/2011 | White ...................... G11C 7/02 |
| | | 365/154 |
| 2014/0211547 A1 | 7/2014 | Kapre et al. |
| 2015/0318029 A1* | 11/2015 | Liu ....................... G11C 11/412 |
| | | 365/189.16 |

\* cited by examiner

MEMORY WITH SINGLE-EVENT LATCHUP PREVENTION CIRCUITRY

BACKGROUND

This relates to integrated circuits and, more particularly, to integrated circuits that contain memory.

Integrated circuits often contain volatile memory elements. A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. In programmable logic device integrated circuits, SRAM cells may serve as configuration random access memory (CRAM) cells. Programmable logic devices are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements often occupy a significant portion of an integrated circuit and are prone to semiconductor reliability issues such as latch-up. Latch-up is a type of short circuit that can sometime arise between the power supply rails of a memory element. Each memory element includes at least an n-channel transistor coupled to a p-channel transistor, which effectively forms a parasitic silicon-controlled rectifier (SCR) structure in the semiconductor substrate. During a single-event latch-up, heavy ions or protons from cosmic rays or other source of ionizing radiation can strike the SCR, which might cause parasitic bipolar transistors in the SCR to conduct, thereby creating a low resistance path between the positive and ground power supply rails. When this occurs, the latch-up may result in circuit malfunction or potentially destruction of the entire device.

It is within this context that the embodiments described herein arise.

SUMMARY

An integrated circuit that includes memory cells coupled to single event latch-up (SEL) prevention circuitry is provided. Each memory cell may include cross-coupled inverters and access transistors. Each inverter in the cross-coupled inverters may include an n-channel transistor and a p-channel transistor coupled in series between a positive power supply line and a pull-down node.

The SEL prevention circuitry may be coupled to the pull-down node and the p-channel transistor of each memory cell. In particular, the SEL prevention circuitry may include a clamping circuit that is connected directly between the pull-down node and a ground power supply line. The clamping circuit may be an n-channel pull-down transistor that is always turned on during normal operation of the integrated circuit.

The SEL prevention circuitry may also include a voltage sensing circuit having an input that is connected to the pull-down node and an output. The voltage sensing circuit may be implemented as a voltage comparator having a first (positive) input that is directly connected to the pull-down node and a second (negative) input that receives a reference voltage.

The SEL prevention circuitry may further include a driver circuit that is controlled by the output of the voltage comparator. The driver circuit may be a multiplexing circuit that is configured to provide a selected one of a positive power supply voltage and an elevated power supply voltage to the p-channel transistor in each memory cell. For instance, the p-channel transistor may be formed in an n-well, an n-well tap may be formed in the n-well, and the n-well tap may be actively driven by the multiplexer. The elevated power supply voltage may be at least 30%, at least 40%, or at least 50% greater than the positive power supply voltage. The multiplexer may bias the n-well using the positive power supply voltage most of the time. In response to a single event latch-up, however, the multiplexer may bias the n-well using the elevated power supply voltage to force the n-well into deep reverse bias to mitigate any potential latch-up in the memory cell. Alternatively, the n-well may be permanently biased to the elevated power supply voltage level to reduce circuit complexity.

Further features of the invention, its nature and various advantages will be more apparent from the accompanying drawings and following detailed description.

DETAILED DESCRIPTION

Embodiments of the present invention relate to integrated circuit memory elements that may be subject to single event latch-up (SEL). In accordance with an embodiment, SEL prevention circuitry is provided that uses a sense amplifier to detect a latch-up signal. In response to detecting a latch-up signal, a driver in the SEL prevention circuitry may then force an n-well within the memory elements into deep reverse bias region to temporarily turn off any parasitic components which might be turned on during the single event latch-up. In another suitable arrangement, the n-well of the memory elements may be constantly biased to an elevated voltage level to permanently shut off the parasitic components to completely eliminate latch-up.

It will be recognized by one skilled in the art, that the present exemplary embodiments may be practiced without some or all of these specific details. In other instances, well-known operations have not been described in detail in order not to unnecessarily obscure the present embodiments.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention will sometimes be described in the context of programmable logic device integrated circuits. This is, however, merely illustrative. Memory cells in accordance with embodiments of the present invention may be used in any suitable circuits.

On integrated circuits such as memory chips or other circuits in which memory is needed to store processing data, memory elements 20 perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
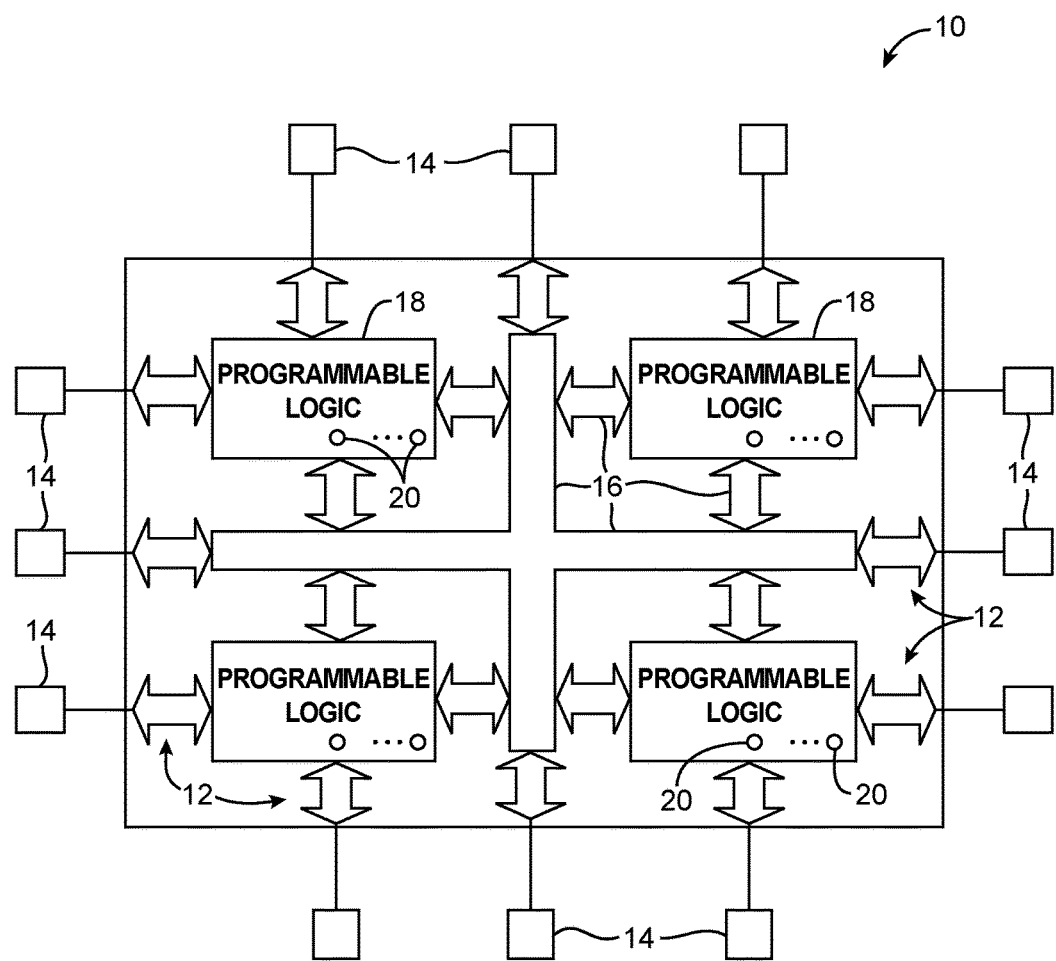
FIG. 1 is a diagram of an illustrative programmable integrated circuit in accordance with an embodiment.

An illustrative integrated circuit such as a programmable logic device 10 is shown in FIG. 1. Device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input-output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control portions of the circuitry in the programmable logic 18 and thereby customize its functions so that it will operate as desired.

Figure 2:
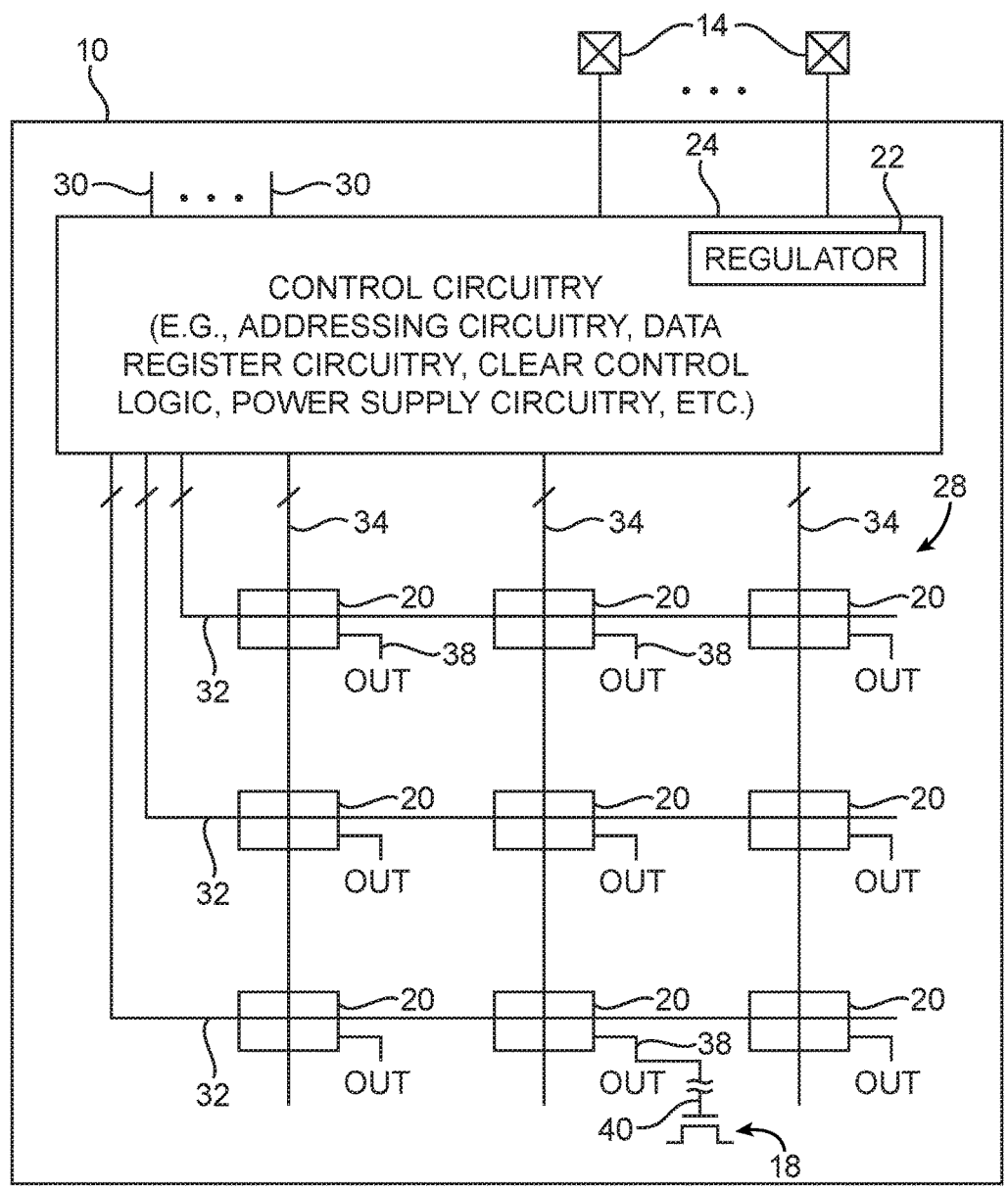
FIG. 2 is a diagram of an illustrative array of memory cells in accordance with an embodiment.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2. As shown in FIG. 2, there may be an array 28 of memory elements 20 in device 10. There are only three rows and columns of elements 20 in the illustrative array of FIG. 2, but in general there may be hundreds or thousands of rows and columns in array 28. Array 28 may be one of a number of arrays on a given device 10, may be a subarray that is part of a larger array, or may be any other suitable group of memory elements 20. Each memory element may supply a corresponding output signal OUT at a corresponding output path 38. In CRAM arrays, each signal OUT is a static output control signal that may be conveyed over a path 40 and used in configuring a corresponding transistor such as transistor 18 or other circuit element in associated programmable logic 18.

Integrated circuit 10 may have control circuitry 24 for supplying signals to memory elements 20 in memory array 28. Control circuitry 24 may receive power supply voltages, data, and other signals from external sources using pins 14 and from internal sources using paths such as paths 30. Control circuitry 24 may include circuitry such as an adjustable voltage supply (regulator 22), address decoder circuitry, address register circuitry, data register circuitry, and/or clear control circuitry. Regulator 22 may be used to produce time-varying power supply voltages. These power supply voltages may be of the same magnitude as the voltages received on pins 14 or may have different magnitudes than the voltage received from pins 14. Control circuitry 24 (e.g., the addressing circuitry, data register circuitry, clear control circuitry, and other control circuitry of circuitry 24) can use the power supply voltages supplied by pins 14 and by regulator 22 to produce desired time-varying and fixed signals on paths such as paths 32 and 34.

There may, in general, be any suitable number of conductive lines associated with paths 32 and 34. For example, each row of array 28 may have one or more associated address lines in a respective one of paths 32 that carries a corresponding address signal (as an example). The address lines are sometimes referred to as a word lines, and the address signals are sometimes referred to as word line signals. Each column of array 28 may have one or more associated data lines in a respective one of paths 34 on which data signals are provided. The data lines are sometimes referred to as bit lines, and the data signals are sometimes referred to as bit line signals. If desired, other patterns of lines may be used in paths 32 and 34. The signals that are supplied to memory elements 20 may sometimes be collectively referred to as control signals. In particular contexts, some of these signals may be referred to as power signals, clear signals, data signals, address signals, etc. These different signal types are not mutually exclusive.

FIG. 2 is a circuit diagram showing one suitable arrangement of memory cell 20. As shown in FIG. 2, the storage portion of cell 20 may include cross-coupled inverting circuits such as circuits INV1 and INV2 each of which has an input and an output. In particular, the input of circuit INV1 may be coupled to the output of circuit INV2, whereas the input of INV2 may be coupled to the output of circuit INV1. The output of circuit INV1 may serve as a first internal data storage node X1 for cell 20 while the output of circuit INV2 may serve as a second internal data storage node X2 for cell 20. The storage portion of cell 20 configured in this way may be used to store a single bit of data (e.g., data storage nodes X1 and X2 may store true and complement versions of a single data bit, respectively). As an example, cell 20 that is storing a high data bit may have data storage nodes X1 and X2 respectively driven to "0" and "1." As another example, cell 20 that is storing a low data bit may have data storage nodes X1 and X2 respectively driven to "1" and "0." Node X2 may be coupled to one or more corresponding pass transistor 40 via path 40, which may be part of programmable logic circuitry 18 on device 10.

Circuit INV1 may include an n-channel transistor N1 and p-channel transistor P1 coupled in series between a first power supply line 100 (e.g., a power supply line on which positive power supply voltage Vcchg is provided) and a second power supply line 102 (e.g., a lower supply line that is supplied with pull-down voltage Vpd). Supply line 102 is therefore sometimes referred to as a pull-down node. Similarly, circuit INV2 may include an n-channel transistor N2 and p-channel transistor P2 coupled in series between power supply lines 100 and 102. N-channel transistor N1 and N2 in the pull-down current path may sometimes be referred to as memory "pull-down" devices, whereas p-channel transistors P1 and P2 may sometimes be referred to as memory "pull-up" devices. The n-channel transistors may be n-channel metal-oxide-semiconductor (NMOS) devices, whereas the p-channel transistors may be p-channel metal-oxide-semiconductor (PMOS) devices (as an example).

Figure 3:
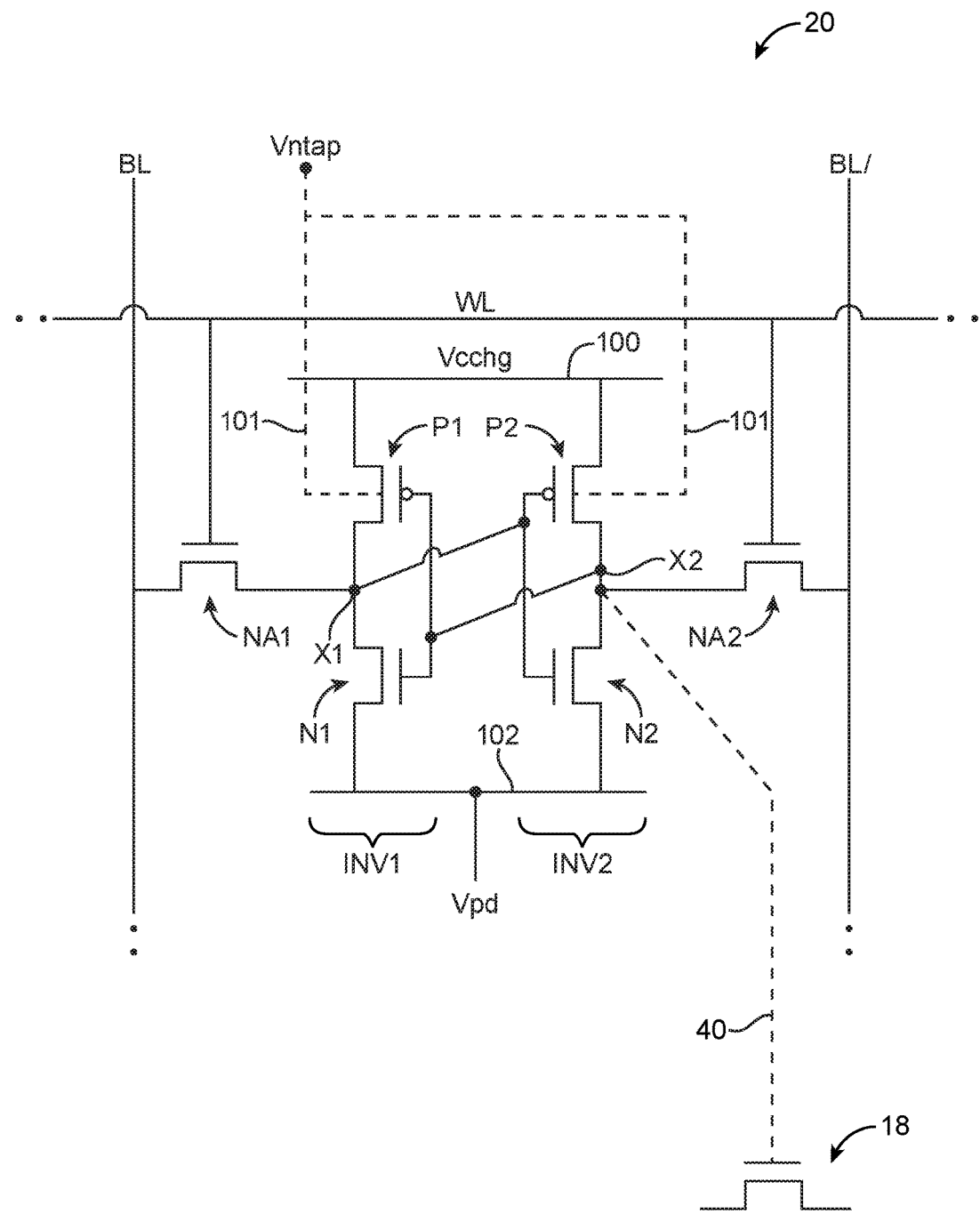
FIG. 3 is a circuit diagram of an illustrative memory cell in accordance with an embodiment.

The storage portion of memory cell 20 may be coupled to access transistors (sometimes referred to as memory address transistors or memory "pass gate" transistors) such as transistors NA1 and NA2 to perform read and write operations. In the example of FIG. 3, access transistor NA1 may be coupled between a first data line (e.g., a true data line on which true bit line signal BL is conveyed) and first data storage node X1, whereas access transistor NA2 may be coupled between a second data line (e.g., a complementary data line on which complement bit line signal BL/ is conveyed) and second data storage node X2. Transistors NA1 and NA2 may each have a gate that is coupled to an address line on which word line signal WL is conveyed.

During normal operation, the true and complementary data lines may be nominally driven to zero volts to minimize leakage currents, whereas word line signal WL may be deasserted (e.g., address signal WL may be pulled low to disable access transistors NA1 and NA2). During write operations, desired data signals may be presented on the first and second data lines before word line signal WL is asserted to enable access transistors NA1 and NA2 to write in a desired value into memory cell 20. During read operations, the first and second data lines are precharged to a high voltage level before word line signal WL is asserted to enable access transistors NA1 and NA2 to read out a currently stored value in memory cell 20.

Still referring to FIG. 3, each p-channel transistor in the storage portion of memory cell 20 may have a body terminal that is coupled to control line 101. Line 101 may be biased to an n-well tap voltage Vntap. By dynamically adjusting the voltage level of signal Vntap, potential latch-up issues that may occur in memory cell 20 may be mitigated.

Figure 4:
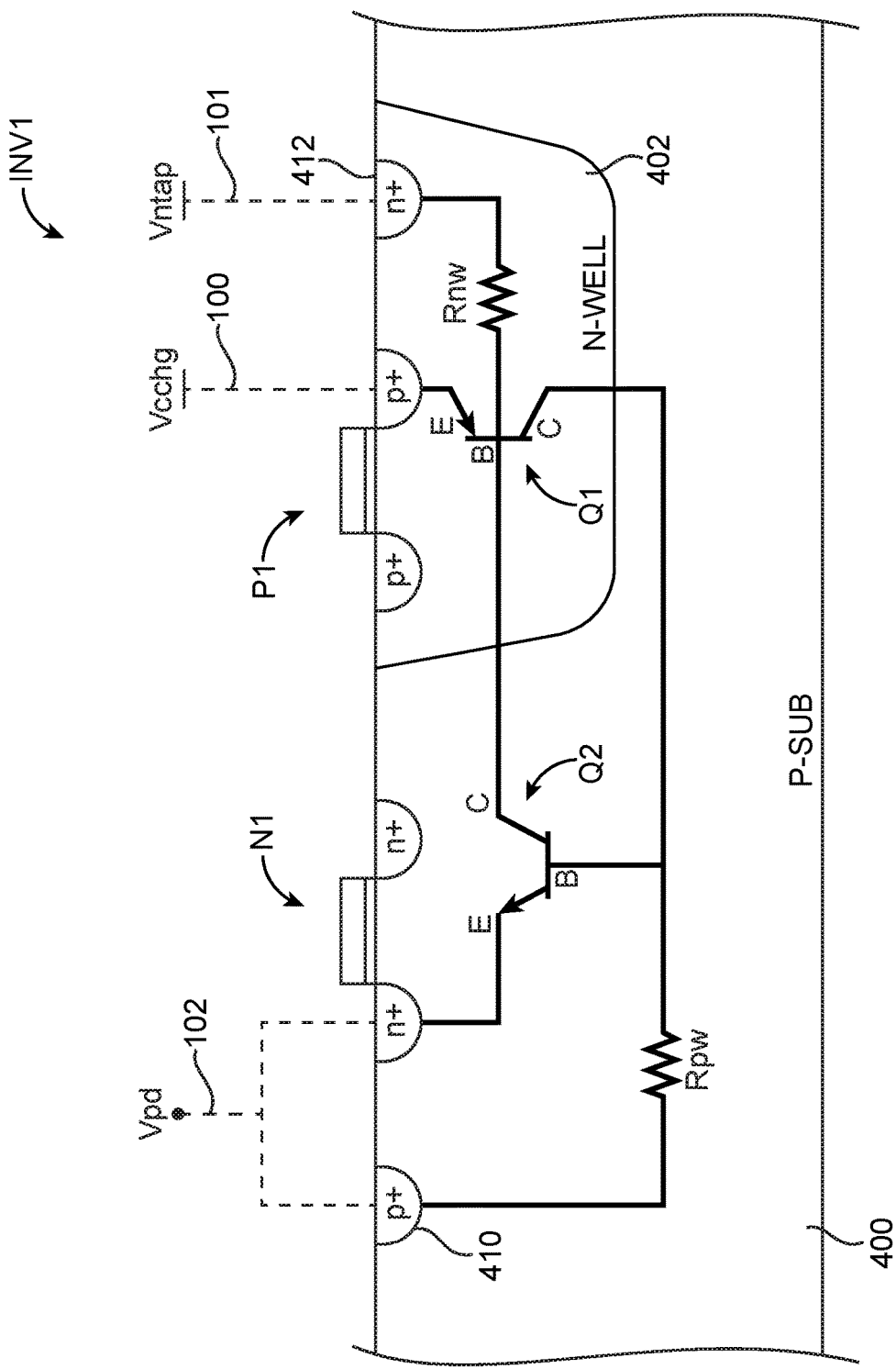
FIG. 4 is a cross-sectional side view illustrating a parasitic silicon-controlled rectifier (SCR) structure in accordance with an embodiment.

FIG. 4 is a cross-sectional side view illustrating a parasitic silicon-controlled rectifier (SCR) structure in memory cell 20. As shown in FIG. 4, n-channel transistor N1 may have n+ source-drain regions formed in a p-type semiconductor substrate such as substrate 400, whereas p-channel transistor P1 may have p+ source-drain regions formed in an n-well such as n-well 402. Transistors N1 and P2 are connected in series to form inverter circuit INV1 of FIG. 3. A p-well tap region such as p+ well tap 410 may be formed directly in p-type substrate 400 to serve as the body bias terminal for n-channel transistor N1 and other NMOS transistors sharing the same bulk. Similarly, an n-well tap region such as n+ well tap 412 may be formed directly in n-well 402 to serve as the body bias terminal for p-channel transistor P1 and other PMOS transistors sharing the same n-well 402.

FIG. 4 also shows intrinsic bipolar junction transistors (BJT) such as BJT devices Q1 and Q2 that can be formed in substrate 400. Components Q1 and Q1 and resistors Rpw and Rnw (marked using bolded lines in FIG. 4) represent parasitic components in the circuit formed merely as a byproduct of the CMOS process and are not actual discrete devices intentionally formed by the circuit designer. In particular, parasitic transistor Q1 may be a PNP bipolar transistor having an emitter (E) terminal coupled to power supply line 100, a base (B) terminal that is coupled to control line 101 via intrinsic n-well resistance Rnw, and a collector (C) terminal. Parasitic transistor Q2 may be an NPN bipolar transistor having an emitter terminal coupled to pull-down node 102, a collector terminal coupled to the based terminal of transistor Q1, and a base terminal that is coupled to the collector terminal to Q1 and also to p-well tap region 410 via intrinsic p-well resistance Rpw.

Configured in this way, the PNP transistor and the NPN transistor are stacked in a feedback arrangement commonly referred to as a thyristor or a silicon controlled rectifier (SCR). This SCR structure may be particularly prone to latch-up, which is a type of short circuit that can occur one device 10. For example, during a single event latch-up when an alpha particle strikes an internal data storage node in memory cell 20, a node that should otherwise be at zero volts might see a temporary voltage spike. This transient voltage spike might inadvertently turn on one of transistors Q1 or Q2. Eventually, both parasitic transistors are turned on for as long as the SCR structure is forward-biased, which usually leads to breakdown of an internal junction and can permanently damage the device.

Conventional single event latch-up (SEL) mitigation schemes include reducing the well tap distance to minimize the intrinsic well resistances, increasing well doping to similarly reduce the voltage drop, reducing parasitic transistor gain via transistor sizing and channel doping, reducing the memory cell supply voltage Vcchg, or adding an additional PMOS transistor in the memory cell pull-up path, wherein the additional PMOS transistor is shared among a column of memory cells. These techniques, however, typically increase die area and reduces maximum memory performance. It would therefore be desirable to provide an improved way of mitigating SEL.

Figure 5:
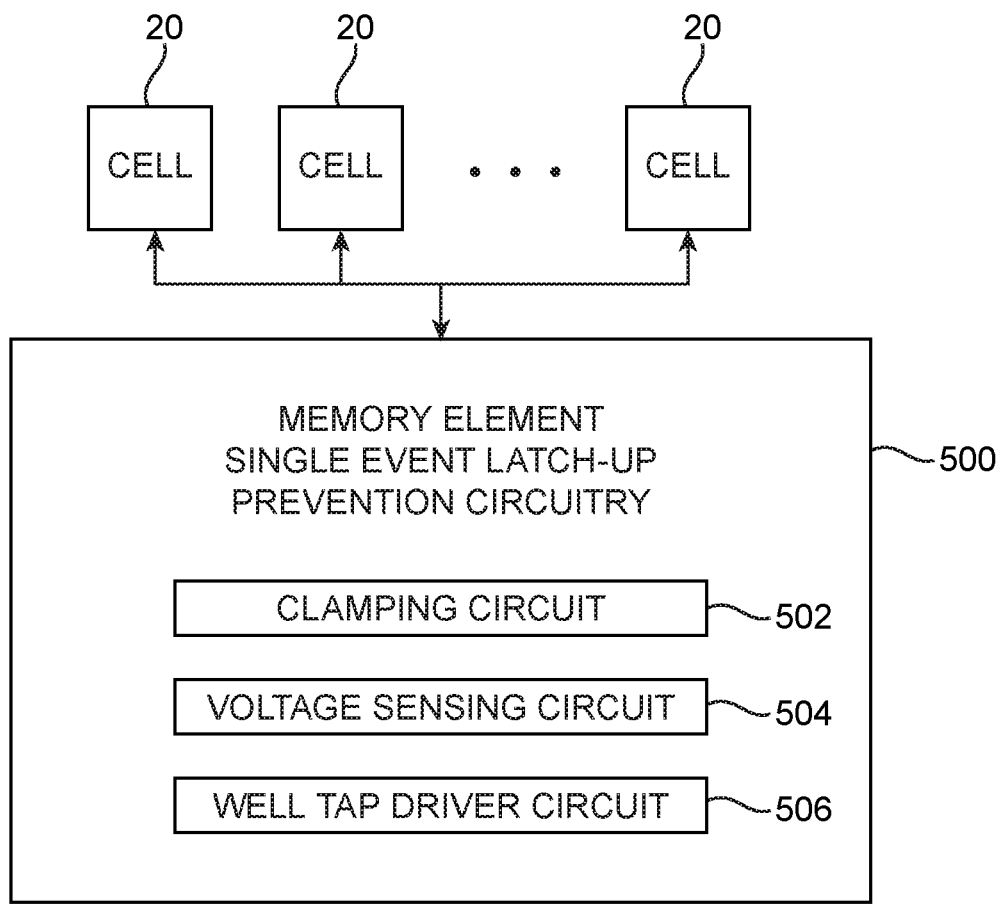
FIG. 5 is a diagram of a group of memory cells that is coupled to single event latch-up prevention circuitry in accordance with an embodiment.

In accordance with an embodiment, FIG. 5 shows a group of memory cells that is coupled to single event latch-up prevention circuitry such as memory element SEL prevention circuitry 500. The group of memory cells may belong to a row of memory cells that are coupled to a common word line in the array or may belong to a column of memory cells that are coupled to a common pair of bit lines in the array.

As shown in FIG. 5, SEL prevention circuitry 500 may include a clamping circuit such as clamping circuit 502, a voltage sensing circuit such as voltage sensor 504, and a well tap driver circuit such as well tap driver 506. Clamping circuit 502 may allow an internal node voltage in memory cell 20 to rise in response to a single-event perturbation. Voltage sensor 504 may be a comparator that picks up a latch-up signal. Well tap driver 506 may then force the n-well (e.g., n-well 402 of FIG. 4) within memory cell 20 into deep reverse bias region to prevent the latch-up.

Figure 6:
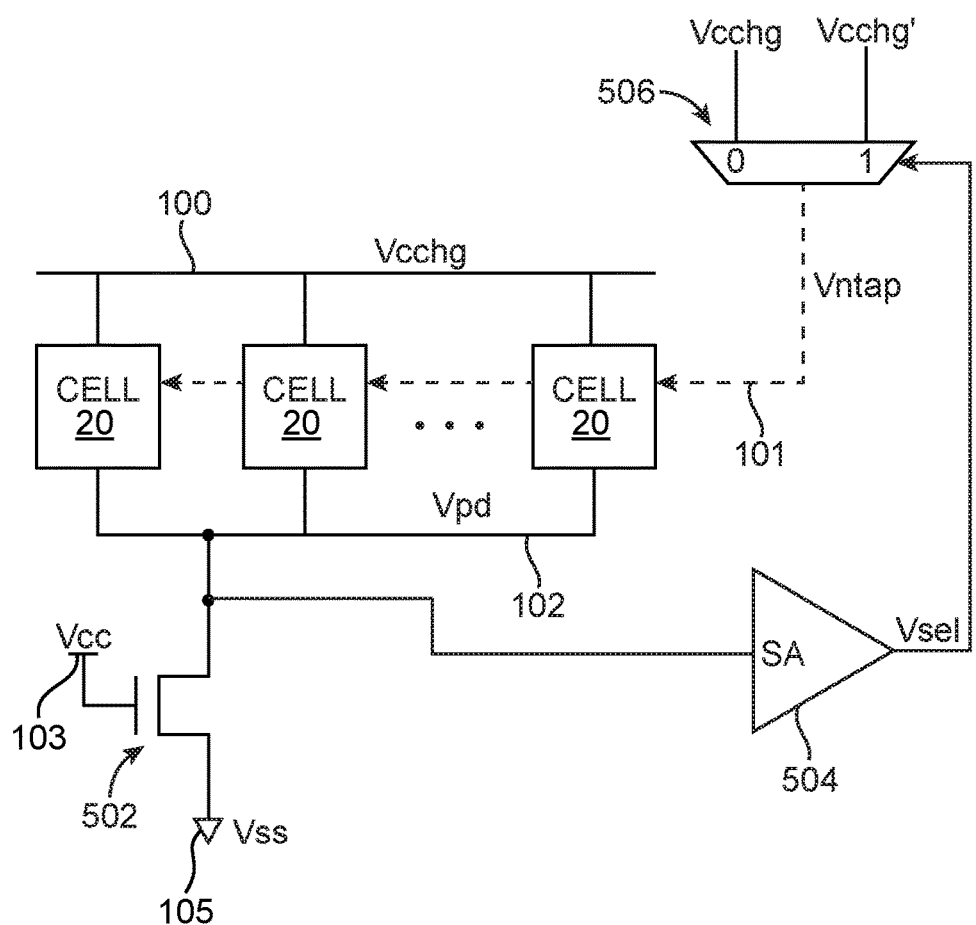
FIG. 6 is a circuit diagram showing one suitable implementation of latch-up prevention circuitry in accordance with an embodiment.

FIG. 6 is a circuit diagram showing one suitable implementation of latch-up prevention circuitry 500. As shown in FIG. 6, the group of memory cells 20 may be powered using positive power supply line 100 and may also be coupled to a shared pull-down node 102. Clamping circuit 502 may be an n-channel clamping transistor having a drain terminal that is connected to node 102, a source terminal that is connected to ground line 105 (e.g., a ground power supply line on which ground voltage Vss is supplied), and a gate terminal that is connected to power supply line 103 (e.g., a power supply line on which positive power supply voltage Vcc is provided). Memory cell voltage Vcchg may equal to or greater than power supply voltage Vcc. As an example, voltage Vcc may be equal to 0.85 V, whereas voltage Vcchg may be equal to 1.2 V. Biased as such, clamping transistor 502 is always turned on during normal operation of the integrated circuit.

Voltage sensing circuit 504 may be a sense amplifier or a voltage comparator having an input that receives voltage Vpd from node 102 and an output at which corresponding control signal Vsel is generated. When node 102 is nominally at zero volts, sense amplifier 504 will keep signal Vsel at a logic "0." When node 102 rises above a predetermined threshold, sense amplifier 504 will detect the temporary voltage rise and will drive signal Vsel to a logic "1."

Signal Vsel output from circuit 504 may be used to control driver circuit 506. Driver 506 may be implemented as a multiplexer having a control input that receives signal Vsel, a first (0) data input that receives voltage Vcchg, a second (1) data input that receives voltage Vcchg', and an output on which a selected one of input voltages Vcchg and Vcchg' may be routed. If selected signal Vsel is low, multiplexer 506 may drive its output to Vcchg. If select signal Vsel is high, multiplexer 506 may drive its output to Vcchg'. Voltage Vcchg' may be greater than Vcchg. For example, if Vcchg is 1.2 V, Vcchg' might be equal to 1.8 V. In general, elevated voltage Vcchg' may be at least 10%, 20%, 30%, 40%, or 50% greater than voltage Vcchg. The output of multiplexer 506 may be connected to the n-well tap of each memory cell 20 in the group via path 101. Thus, the n-well of each memory cell 20 will be biased to either Vcchg or Vcchg' depending on the value of select signal Vsel.

Configured in this way, a random particle strike that might potentially cause a circuit latch-up will force an internal data storage node in one of memory cells 20 to rise, which will in turn result in a temporarily voltage rise at node 102. When pull-down node voltage Vpd at node 102 rises, sense amplifier 504 will detect the instantaneous voltage rise, which will then drive control signal Vsel high. When signal Vsel is driven high, multiplexer 506 may then drive n-well tap voltage Vntap to elevated voltage level Vcchg', which reverse biases the n-well region, thereby shutting off the parasitic bipolar junction transistors in the SCR structure.

Figure 7:
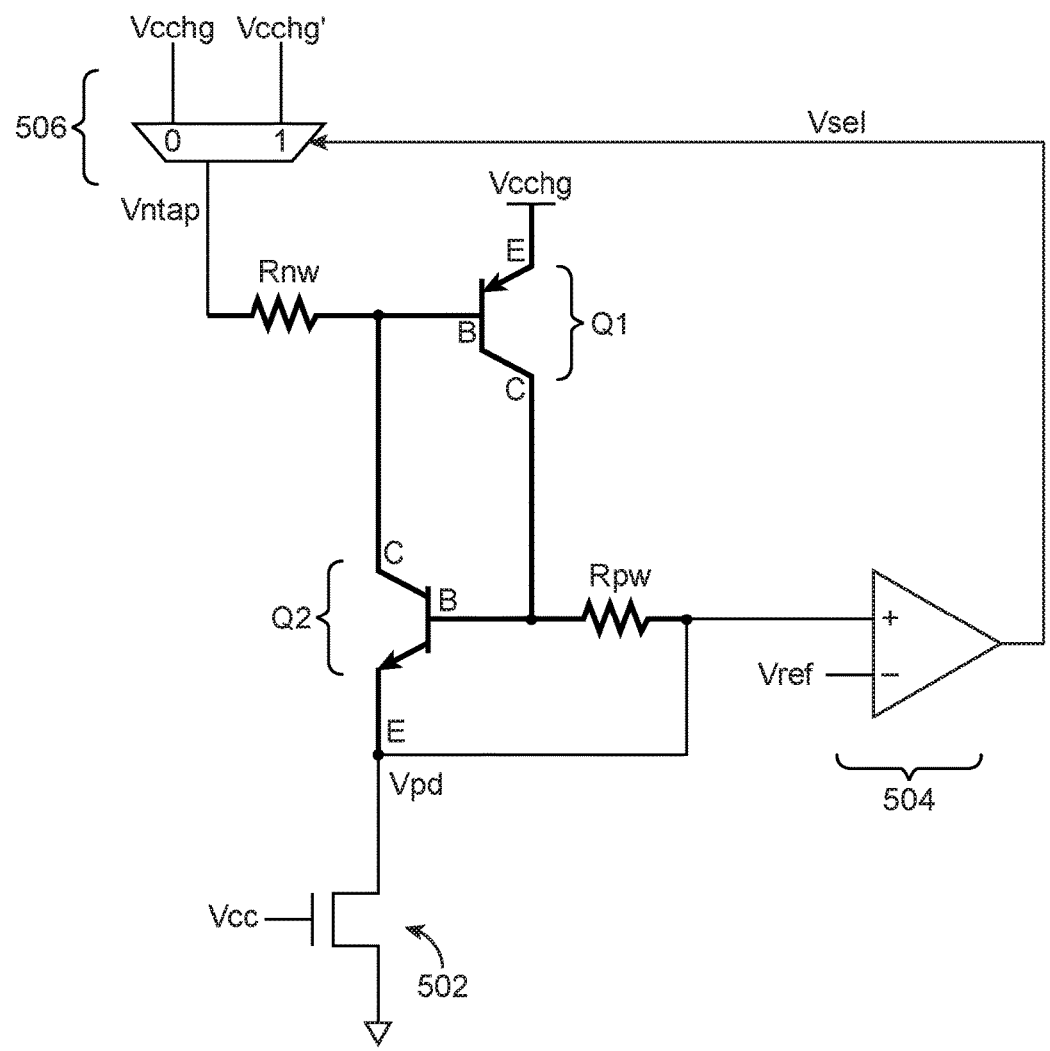
FIG. 7 is a diagram illustrating how the latch-up prevention circuitry of FIG. 6 can be used to turn off the parasitic SCR structure in a memory element in accordance with an embodiment.

FIG. 7 is a schematic diagram showing how the SEL prevention circuitry of FIG. 6 is connected to the parasitic SCR structure described above in connection with FIG. 4. Clamping transistor 502 may be connected between emitter of BJT Q2 and the ground line. Sensing circuit 504 may be implemented as a comparator having a first (+) terminal that is connected to intrinsic p-well resistance Rpw and a second (−) terminal that receives a reference voltage Vref. Voltage level Vref may 0-50 mV or other predetermined reference voltage level suitable for sensing a single-event voltage perturbation. The output of driver 506 may be connected to intrinsic n-well resistance Rnw. When voltage Vntap at the output of driver 506 is biased to elevated voltage level Vcchg', transistor Q1 will be shut off since the base-to-emitter voltage $V_{BE}$ of transistor Q1 is now in reverse bias. Turning transistor Q1 off will in turn shut transistor Q2 off since no current can flow to the base of transistor Q2.

Figure 8:
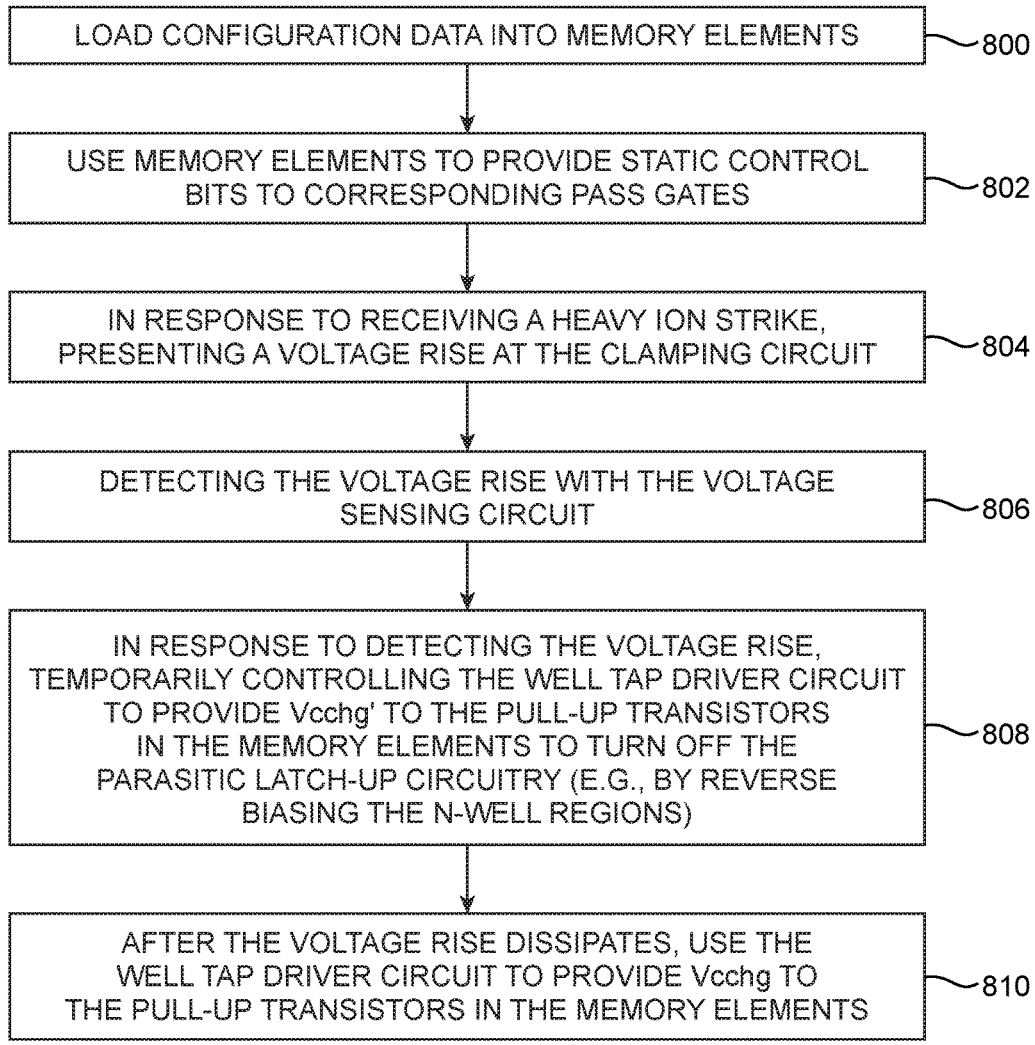
FIG. 8 is a flow chart of illustrative steps for operating memory cell latch-up prevention circuitry in accordance with an embodiment.

FIG. 8 is a flow chart of illustrative steps for operating memory cell latch-up prevention circuitry 500. At step 800, configuration data may be loaded into memory cells 20 (e.g., via initial device configuration or partial reconfiguration operations). Once loaded with configuration data, memory cells 20 may be used to provide static control signals to control corresponding pass gates in programmable circuitry 18 (step 802). See, e.g., FIGS. 1 and 2.

SEL prevention circuitry 500 may be switched out of use until an SEL event is detected. In response to memory cell 20 receiving a heavy ion strike, a temporary voltage rise may be observed at clamping circuit 502 (step 806). At step 806, sensing circuit 504 may then detect the temporary voltage rise at the clamping circuit.

In response to detecting the voltage rise, sensing circuit 504 may direct well tap driver 506 to provide elevated voltage Vcchg' to the n-well tap region of the pull-up transistors in memory cells 20 to help turn off the parasitic latch-up circuitry (step 808). The actual prevention of the single event latch-up may be effectuated by reverse biasing the n-well region in which the memory cell pull-up transistors are formed.

After the temporarily voltage perturbation dissipates, pull-down node voltage Vpd will be driven back down to ground, and sensing circuit 504 will drive Vsel back down to a logic "0." As a result, the well tap driver circuit will be configured to provide nominal memory cell voltage Vcchg to the memory cell pull-up transistors so that memory cells 20 can operate as intended (step 810).

These steps are merely illustrative and are not intended to limit the scope of the present embodiments. The existing steps may be modified or omitted; some of the steps may be performed in parallel; additional steps may be added; and the order of certain steps may be reversed or altered.

Figure 9:
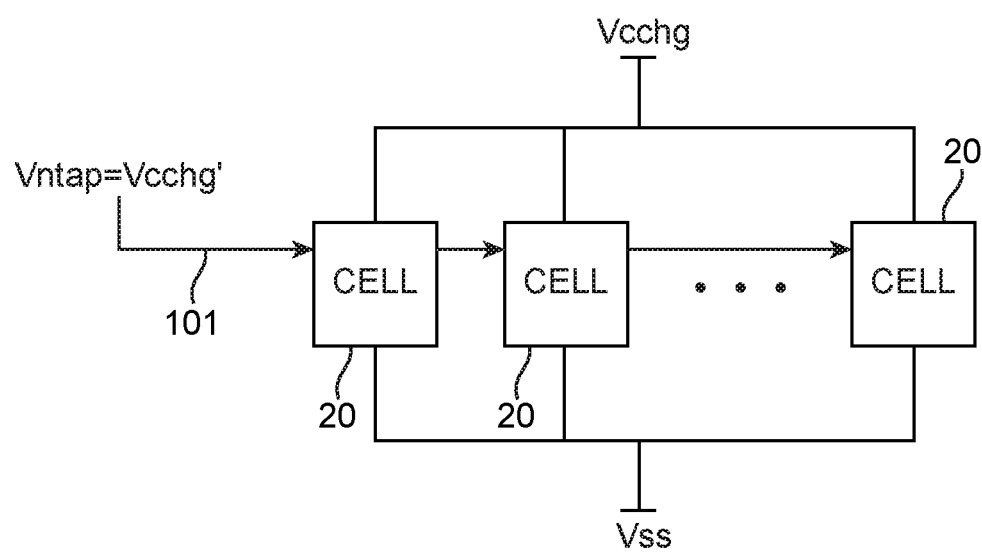
FIG. 9 is a diagram showing how an n-well tap for a group of memory cells can be biased to a fixed, elevated voltage level to permanently shut off the parasitic SCR structure in accordance with an embodiment.

In another suitable arrangement, the n-well tap of each memory cell 20 in the group may be permanently or statically biased to elevated voltage Vcchg' (see, e.g., FIG. 9). As shown in FIG. 9, no clamping circuit is needed, so each memory cell 20 may be directly connected to the ground line (i.e., the clamping transistor can be omitted). Since there is no longer a clamping circuit, voltage sensing circuit 504 and multiplexer 506 can likewise be omitted, which further reduces memory cell area. This approach permanently prevent SEL at the expense of increased static current leakage and reduced circuit performance (since constantly driving the n-well in reverse bias mode throughout operation of the integrated circuit degrades the drive strength of the memory cell pull-up transistors).

If desired, the selective n-well biasing scheme described above can be implemented in a column or a small block of memory depending on the intended application. The reference voltage of the comparator circuit of FIG. 7 can be optimized to reduce the impact of any CRAM leakage increase arising from the reverse biasing step. Moreover, the duration for which multiplexing driver 506 is activated in response to a SEL can be adjusted and optimized for latch-up turn-off and to reduce the impact of transient CRAM leakage increase.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:

1. An integrated circuit, comprising:
a memory cell that includes an n-channel transistor and a p-channel transistor coupled in series between a power supply line and a pull-down node; and
single event latch-up prevention circuitry that is connected to the pull-down node and the p-channel transistor in the memory cell.

2. The integrated circuit of claim 1, wherein the single event latch-up prevention circuitry comprises:
a clamping circuit that is connected between the pull-down node and a ground line.

3. The integrated circuit of claim 2, wherein the clamping circuit comprises another n-channel transistor that is always turned on during normal operation of the integrated circuit.

4. The integrated circuit of claim 1, wherein the single event latch-up prevention circuitry comprises:
a voltage sensing circuit having an input that is connected to the pull-down node and an output.

5. The integrated circuit of claim 4, wherein the voltage sensing circuit comprises a comparator having a first input that is directly connected to the pull-down node and a second input that receives a reference voltage.

6. The integrated circuit of claim 4, wherein the single event latch-up prevention circuitry further comprises:
a driver circuit that receives a control signal from the output of the voltage sensing circuit and that provides a selected one of first and second voltages to the p-channel transistor in the memory cell.

7. The integrated circuit of claim 6, wherein the driver circuit comprises a multiplexer having a first input that receives the first voltage, a second input that receives the second voltage, and an output that is coupled to the p-channel transistor in the memory cell.

8. The integrated circuit of claim 7, wherein the first voltage is biased at a positive power supply voltage level, and wherein the second voltage is at least 30% greater than the first voltage.

9. The integrated circuit of claim 1, wherein the p-channel transistor is formed in an n-well, the integrated circuit further comprising:
an n-well tap formed in the n-well that is directly driven by the single event latch-up prevention circuitry.

10. The integrated circuit of claim 1, further comprising:
an additional memory cell that includes another n-channel transistor and another p-channel transistor coupled in series between the power supply line and the pull-down node, wherein the p-channel transistor and the another p-channel transistor have body terminals that are connected to the single event latch-up prevention circuitry.

11. A method of operating an integrated circuit that includes a memory cell that is coupled to single event latch-up prevention circuitry, the method comprising:
loading data onto the memory cell;
with the single event latch-up prevention circuitry, detecting for a single event latch-up in the memory cell; and
in response to detecting the single event latch-up, activating the single event latch-up prevention circuitry to mitigate the single event latch-up in the memory cell.

12. The method of claim 11, wherein detecting for the single event latch-up comprises outputting a temporary voltage rise at a clamping circuit in the single event latch-up prevention circuitry.

13. The method of claim 12, wherein detecting for the single event latch-up further comprises determining whether the temporary voltage rise exceeds a predetermined threshold level.

14. The method of claim 11, further comprising:
while the single event latch-up prevention circuitry is deactivated, using the single event latch-up prevention circuitry to provide a first voltage to an n-well in the memory cell.

15. The method of claim 14, wherein activating the single event latch-up prevention circuitry comprises using the single event latch-up prevention circuitry to provide a second voltage that is greater than that first voltage to the n-well in the memory cell.

16. The method of claim 15, wherein the second voltage is at least 40% greater than the first voltage.

17. The method of claim 15, wherein the using the single event latch-up prevention circuitry to provide the second voltage to the n-well comprises reverse biasing the n-well.

* * * * *